(12) United States Patent
Kuehlwein

(10) Patent No.: US 6,580,315 B1
(45) Date of Patent: Jun. 17, 2003

(54) SYSTEM AND METHOD OF MAINTAINING AN AMPLIFIER COMMON-MODE OUTPUT VOLTAGE

(75) Inventor: Jeremy R. Kuehlwein, Woodbury, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/115,654

(22) Filed: Apr. 4, 2002

(51) Int. Cl.[7] ............................................... H03F 1/02
(52) U.S. Cl. ........................ 330/9; 330/11; 330/51; 327/307
(58) Field of Search ............................... 330/9, 11, 51; 327/307

(56) References Cited

U.S. PATENT DOCUMENTS 4,430,622 A * 2/1984 Simoes ........................... 330/9
6,310,519 B1 * 10/2001 Ross ............................. 330/289

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

A low-power solution for maintaining an amplifier common-mode output voltage, regardless of whether the amplifier is on or off, that does not degrade the performance of the amplifier through the use of a passgate in the signal path.

19 Claims, 2 Drawing Sheets ent of the present invention. The circuit 100 includes a basic amplifier in a common-emitter configuration with resistor R1 as the load resistance as discussed herein before.

SYSTEM AND METHOD OF MAINTAINING AN AMPLIFIER COMMON-MODE OUTPUT VOLTAGE

BACKGROUND OF THE INVENTION

1. Field of the Invention

This invention relates generally to amplifiers, and more particularly, to a technique for maintaining an amplifier common-mode output voltage, regardless of whether the amplifier is on or off.

2. Description of the Prior Art

The common-mode output of an amplifier, in some applications, is required to remain at the same voltage, regardless of whether the amplifier is on or off. Two common solutions to achieve this requirement that are known in the art are shown in FIGS. 1 and 2. Each figure shows a basic amplifier in a common-emitter configuration with resistor R1 as the load resistance.

Looking now at FIG. 1, one solution is illustrated for maintaining the output voltage $V_{out}$ at a constant voltage in which the current source $I_{high}$ is always 'ON'. This solution however, is not a good low power solution, as $I_{high}$ can be a substantially large current to achieve a high gain. Further, when using this solution, steps need to be taken to ensure that the AC input signal does not pass through to the amplifier output. If there are multiple cascaded amplifier stages, this is usually accomplished by shutting off the preceding stages while leaving the output stage on to maintain the common-mode output voltage.

FIG. 2 illustrates another solution for maintaining the output voltage $V_{out}$ at a constant voltage that is well known in the art. The solution depicted in FIG. 2 has the same basic amplifier as shown in FIG. 1 with the addition of voltage reference circuitry ($I_{ref}$ and $R_{ref}$) and two passgates or switches (M0 and M1). The voltage reference circuitry is generally scaled to achieve a low-power solution. This is done by making $I_{ref}$ X-times smaller than $I_{high}$ and by making $R_{ref}$ X-times larger than R1 such that the voltage drop across $R_{ref}$ is the same as the voltage drop across R1. As the amplifier is shut down (by turning off $I_{high}$), the output $V_{out}$ is disconnected from the amplifier and is connected to the voltage reference by turning off M1 and tuning on M0. This does provide a low-power solution to maintaining the amplifier common-mode voltage. This solution however, also degrades the performance of the amplifier when the amplifier is on. Since M1 is in the signal path of the amplifier, it introduces another pole and reduces the overall amplifier bandwidth. The additional RC pole is due to the on-resistance of the MOS switch M1 and the capacitance at the $V_{out}$ node. By increasing the size of M1, the on-resistance of M1 can be reduced. Increasing the size of M1 however, also increases the parasitic capacitance associated with M1, which then lowers the frequency of the pole at R1.

In view of the foregoing, it would be desirable and advantageous in the amplifier art to provide a low-power solution for maintaining an amplifier common-mode output voltage, regardless of whether the amplifier is on or off, that does not degrade the performance of the amplifier through the use of a passgate in the signal path.

SUMMARY OF THE INVENTION

The present invention is directed to a low-power solution for maintaining an amplifier common-mode output voltage, regardless of whether the amplifier is on or off, that does not degrade the performance of the amplifier through the use of a passgate in the signal path.

In one aspect of the invention, a system and method for maintaining an amplifier common-mode output voltage, regardless of whether the amplifier is on or off, is implemented without a passgate or switch in the signal path of the amplifier, such that the bandwidth of the amplifier is not degraded.

In another aspect of the invention, a system and method for maintaining an amplifier common-mode output voltage, regardless of whether the amplifier is on or off, is implemented without necessitating the continuous, uninterrupted flow from the current source ($I_{high}$), such that a high gain can be achieved while simultaneously achieving a low-power solution to maintaining the amplifier common-mode output voltage.

BRIEF DESCRIPTION OF THE DRAWINGS

Other aspects, features and advantages of the present invention will be readily appreciated as the invention becomes better understood by reference to the following detailed description when considered in connection with the accompanying drawing figures wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
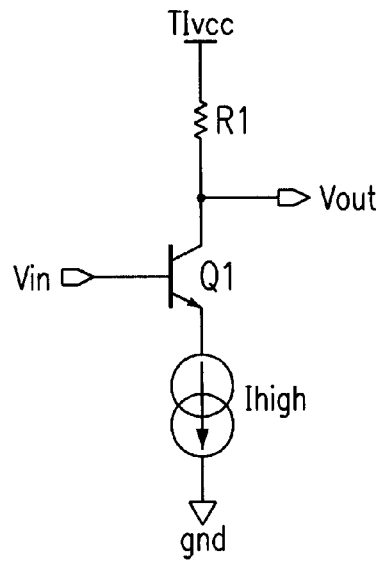
FIG. 1 is a schematic diagram illustrating a prior art solution to maintaining an amplifier common-mode output voltage at a constant voltage by leaving the current source on all the time.
Figure 2:
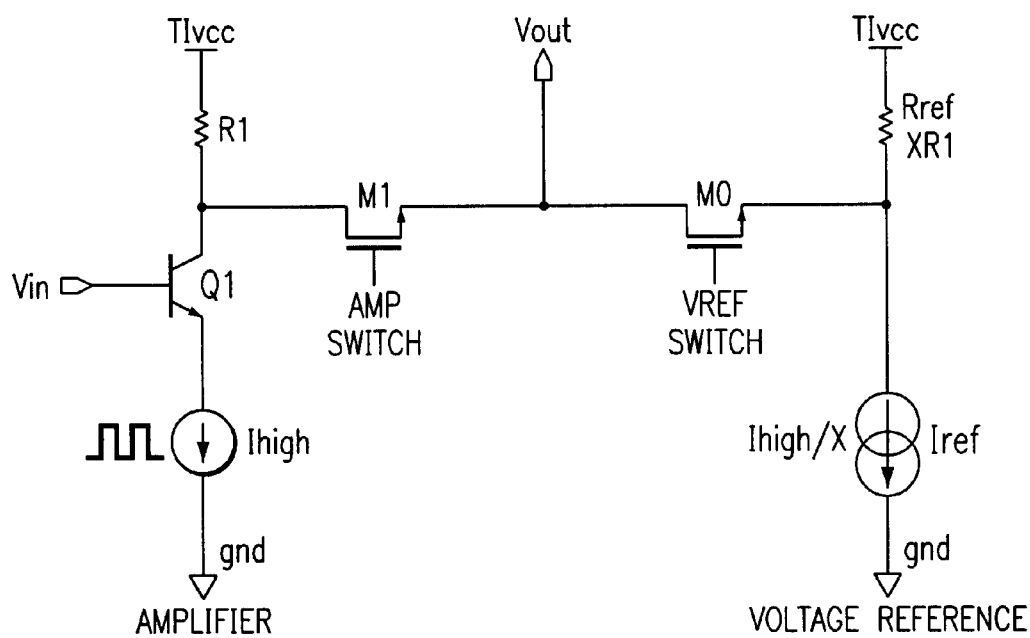
FIG. 2 is a schematic diagram illustrating another prior art solution to maintaining an amplifier common-mode output voltage at a constant voltage.

As stated herein before, the common-mode output of an amplifier, in some applications, is required to remain at the same voltage, regardless of whether the amplifier is on or off. Two common solutions to achieve this requirement that are known in the art are shown in FIGS. 1 and 2. Each figure shows a basic amplifier in a common-emitter configuration with resistor R1 as the load resistance. These figures have been discussed in detail herein before, and so a further detailed discussion of these solutions will not be made herein below in order to preserve brevity and clarity.

Figure 3:
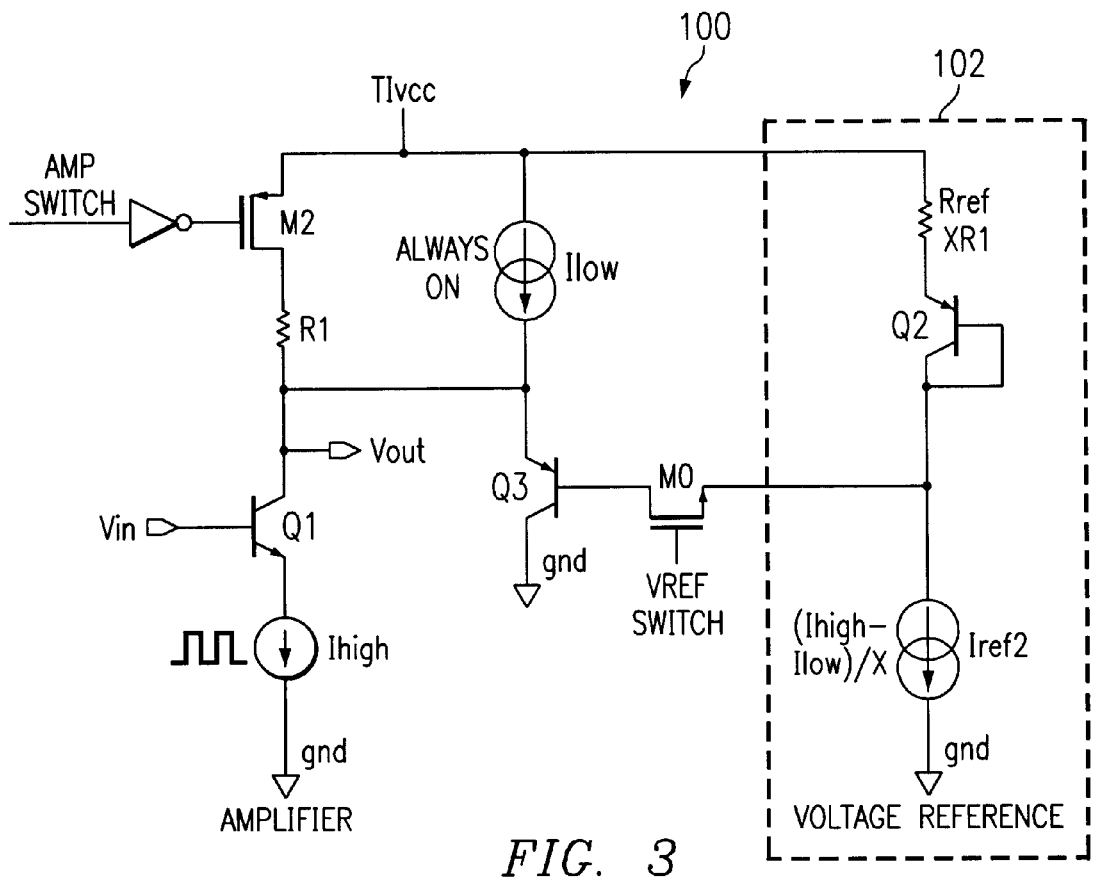
FIG. 3 is a schematic diagram illustrating a solution to maintaining an amplifier common-mode output voltage at a constant voltage according to one embodiment of the present invention.

Looking now at FIG. 3, a schematic diagram illustrates a solution (circuit) 100 to maintaining an amplifier common-mode output at a constant voltage according to one embodiment of the present invention. This circuit 100 maintains the amplifier common-mode output voltage while overcoming the shortfalls of the two prior art circuits discussed herein before. The circuit 100 is basically the same as that shown in FIG. 1 with the addition of voltage reference circuitry ($I_{ref2}$, Q2, and $R_{ref}$), current source $I_{low}$, low impedance device Q3, and two passgates or switches (M0 and M2). Current source $I_{low}$ is always 'ON' and provides a current much lower in magnitude than that provided by current source $I_{high}$. The voltage reference 102 operates similar to the voltage reference discussed in association with FIG. 2 in that voltage reference 102 is scaled for low-power. Current source $I_{ref2}$ however, is equal to $(I_{high}-I_{low})/X$ to account for the effects of current source $I_{low}$. Further, Q2 has been added to compensate for the $V_{BE}$ voltage of transistor Q3.

Figure 4:
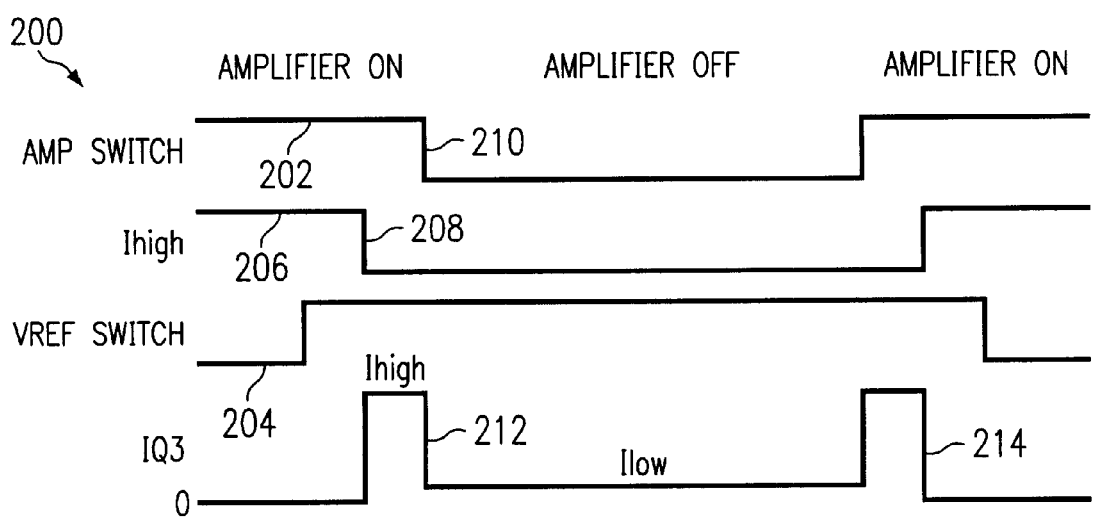
FIG. 4 is a timing diagram illustrating the sequence of timing between switching the two switches (AMP switch and $V_{REF}$ switch) and the current source $I_{high}$ depicted in FIG. 3 and that is very important to achieving the desired low-power solution to maintaining amplifier common-mode output voltage.

Looking now at FIG. 4, a timing diagram 200 depicts the sequence of timing between switching the two switches (M2 via AMP switch and M0 via $V_{REF}$ switch) and the current source $I_{high}$. This sequence of timing is very important to achieving the desired low-power solution. Starting now at the beginning of the timing diagram 200, and with continued reference also to FIG. 3, it can be seen that when the amplifier is on, AMP switch 202 is high turning on switch M2, $I_{high}$ is 'ON', and $V_{REF}$ switch 204 is low, turning off switch M0. The current through resistor R1 is $I_{high}-I_{low}$. The current provided by current source $I_{ref2}$ is X-times smaller than $I_{high}-I_{low}$; and $R_{ref}$ is X-times larger than R1, as can be seen in FIG. 3. This ensures that the voltage drop across $R_{ref}$ is the same as the voltage drop across R1. When turning off the amplifier, the first event to occur is turning 'ON' switch M0 via the $V_{REF}$ switch signal 204 transitioning from low to high. The second event is turning 'OFF' $I_{high}$ 206; and the final event is turning 'OFF' switch M2 via AMP switch 202 transitioning from high to low. The $V_{REF}$ switch signal 204 must transition high, turning switch M0 'ON', before turning off $I_{high}$ 206 to prevent $V_{OUT}$ from going high. The AMP switch signal 202 must transition low, turning switch M2 'OFF', after turning off $I_{high}$ 206 to prevent $V_{OUT}$ from going low and saturating transistor Q1. It can readily be appreciated by those skilled in the art that the timing of the foregoing events described herein above, is controlled by timing circuitry. So long as the desired results are produced, any appropriate timing circuitry can be used. Such timing circuitry should also control the duration of these very important events to ensure proper operation over all operating conditions.

The amplifier output $V_{OUT}$ continues to be held at the same voltage by the low impedance device Q3 between the times 208 when current source $I_{high}$ 206 is turned off and the time 210 when the AMP switch signal 202 transitions low. The same voltage drop therefore exists across resistor R1; and the same current passes through resistor R1. Since current source $I_{high}$ 206 is off during this time period, transistor Q3 sinks the same amount of current as the current source $I_{high}$ 206 when on. When the AMP switch signal 202 transitions low, turning off switch M2, transistor Q3 is required to only sink current $I_{low}$. This pulse of high current, $I_{Q3}$ 212, through transistor Q3 is shown as the bottom waveform in timing diagram 200. Since the duration of this high current pulse 21 is very short, and since the DC current through transistor Q3 is the low level current $I_{low}$, this method for maintaining the common-mode amplifier output voltage provides a low-power solution. Further, since there is no passgate or switch in the signal path of the amplifier such as seen in FIG. 2, the bandwidth of the amplifier is not diminished.

In like fashion, the following detailed discussion sets forth an explanation for the transition from amplifier 'OFF' to amplifier 'ON'. When the amplifier is 'OFF', the AMP switch signal 202 is low, current source $I_{high}$ 206 is 'OFF', and the $V_{REF}$ switch signal 204 is high. When turning on the amplifier, the first event to occur is the turn-on of switch M2 due to AMP switch signal 202 going high. The second event to occur is turning on current source $I_{high}$ 206; and the final event is the turn-off of switch M0 due to $V_{REF}$ switch signal 204 going low. It can be seen that AMP switch signal 202 must transition high, turning switch M2 'ON', before turning on current source $I_{high}$ 206. This sequence prevents amplifier output $V_{OUT}$ from going low and saturating transistor Q1. The $V_{REF}$ switch signal 204 must transition low to turn off switch M0 after turning on current source $I_{high}$ 206 in order to prevent amplifier output $V_{OUT}$ from going high. These events are controlled via requisite timing circuitry as stated herein before. Similar to the conditions under which the amplifier transitions from its 'ON' condition to its 'OFF' condition, transistor Q3 again experiences a high current pulse 214 when the amplifier turns 'ON'. When AMP switch signal 202 transitions high, turning switch M2 'ON', the voltage drop across resistor R1 is developed and high current passes through resistor R1. Since current source $I_{high}$ 206 is not yet on, transistor Q3 must sink this current. Subsequently, when current source $I_{high}$ 206 turns 'ON', the current through transistor Q3 approaches zero.

In summary explanation, a method provides a low-power solution for maintaining an amplifier common-mode output voltage, regardless of whether the amplifier is 'ON' or 'OFF'. The method does not degrade the performance of the amplifier through the use of a passgate in the signal path.

In view of the above, it can be seen the present invention presents a significant advancement in the art of maintaining amplifier common-mode output voltages. Further, this invention has been described in considerable detail in order to provide those skilled in the amplifier art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A circuit for maintaining a substantially constant amplifier common-mode output voltage comprising:

an amplifier having an input and further having an output connected to a load resistor;

an amplifier switch operational to selectively connect the load resistor to a supply voltage when the amplifier switch is closed and disconnect the load resistor from the supply voltage when the amplifier switch is open;

a high current source configured to be turned-on to provide a high level current after the amplifier switch is closed and further configured to be turned-off before the amplifier switch is opened;

a low current source configured to be continuously powered-on, and further configured to provide a low level current substantially lower in magnitude than the high level current;

a voltage reference operational to provide a reference voltage dependent on the high level current and the low level current;

a voltage reference switch operational to disconnect the voltage reference from the amplifier after the amplifier switch is closed and high current source is turned on, and further operational to connect the voltage reference to the amplifier before the amplifier switch is opened and high current source is turned off; and a low impedance device configured to couple the reference voltage to the amplifier output when the voltage reference switch is closed such that the amplifier common-mode output voltage remains substantially constant regardless of whether the amplifier is on or off, wherein the low current source provides a low level DC current flow through the low impedance device when the amplifier is turned off to maintain a low power level when the amplifier is turned off.

2. The circuit according to claim 1 wherein the low impedance device is further configured to pass the high level current during a period of time defined between a time the high current source is turned off and a time the amplifier switch is opened, and also during a period of time defined between a time the amplifier switch is closed and a time the high current source is turned on.

3. The circuit according to claim 1 wherein the amplifier is a common-emitter amplifier.

4. The circuit according to claim 1 wherein the amplifier switch is a MOS device.

5. The circuit according to claim 1 wherein the voltage reference switch is a MOS device.

6. The circuit according to claim 1 wherein the low impedance device is a bipolar device.

7. The circuit according to claim 1 wherein the voltage reference comprises a current source dependent on both the low level current and the high level current.

8. A circuit for maintaining a substantially constant amplifier common-mode output voltage comprising:

a common emitter amplifier having an input node, an output node, and an emitter node;

a high current source connected between the emitter node and an amplifier ground;

an amplifier switch connected to a supply voltage;

a load resistor connected at one end to the amplifier output node and connected at its opposite end to the amplifier switch such that the supply voltage is coupled to the load resistor only when the amplifier switch is turned on;

a low current source connected between the supply voltage and the amplifier output node, wherein the low current source is configured to always be turned on;

a low impedance bipolar transistor having an emitter node connected to the amplifier output node, a collector node connected to the amplifier ground, and a base node;

a voltage reference comprising:
  a bipolar device configured as a diode having an input node and an output node;
  a reference resistor connected between the supply voltage and the bipolar device input node; and
  a reference current source connected between the bipolar device output node and the amplifier ground; and
  a voltage reference switch connected between the bipolar device output node and the low impedance bipolar transistor base node.

9. The circuit according to claim 8 wherein the amplifier switch is a MOS device.

10. The circuit according to claim 8 wherein the voltage reference switch is a MOS device.

11. The circuit according to claim 8 wherein the amplifier switch, the voltage reference switch and the high current source are configured such that the voltage reference switch is closed before the amplifier switch is opened and the high current source is turned off, and are further configured such that the voltage reference switch is opened after both the amplifier switch is closed and the high current source is turned on.

12. The circuit according to claim 11 wherein the amplifier switch and the voltage reference switch are further configured such that the current source is turned off before the amplifier switch is opened and is turned back on after the amplifier switch is closed.

13. The circuit according to claim 8 wherein the low impedance bipolar transistor is operational to pass a low level current provided by the low current source during a period of time defined between turn-off and turn-on of the amplifier switch.

14. A circuit for maintaining a substantially constant amplifier common-mode output voltage comprising:

an amplifier;

a high current source;

a low current source; and a voltage reference, wherein the high current source is operational to turn off before the amplifier switch is opened and is further operational to turn on after the amplifier switch is closed, and further wherein a voltage reference switch is operational to turn on before both the amplifier switch and high current source are turned off and is further operational to turn off only after both the amplifier switch and the high current source are turned back on, and further wherein only current supplied by the low current source flows when the amplifier is turned off such that the circuit runs at a low power level when the amplifier is off.

15. The circuit according to claim 14 wherein the amplifier comprises a common emitter amplifier circuit.

16. The circuit according to claim 14 further comprising a low impedance device operational to couple the voltage reference to the amplifier when the voltage reference switch is turned on such that a common-mode output voltage associated with the amplifier remains substantially constant, regardless of whether the amplifier is on or off.

17. A circuit for maintaining a substantially constant amplifier common-mode output voltage comprising:

means for amplifying an AC input signal;

first switching means for selectively coupling a supply voltage to the amplifying means;

means for generating a high level current only before the switching means is turned off and only after the first switching means is turned back on;

means for generating a continuous low level current;

means for generating a reference voltage; and second switching means for connecting the reference voltage to the amplifier before both the first switching means and means for generating a high level current are turned off and further for disconnecting the reference voltage from the amplifier only after both the first switching means and the means for generating a high level current are turned back on, such that only current supplied by the means for generating the continuous low level current flows in the circuit when the amplifier is turned off and such that the circuit runs at a low power level when the amplifier is off.

18. The circuit according to claim 17 wherein the second switching means comprises a low impedance coupling between the voltage reference and the amplifier when the second switching means is turned on such that the common-mode output voltage associated with the amplifier remains substantially constant, regardless of whether the amplifier is on or off.

19. A method for maintaining a substantially constant amplifier common-mode output voltage comprising the steps of:

provyding a circuit comprising an amplifier having an output, an amplifier switch operational to selectively couple the amplifier to a supply voltage, a high level current source, a low level current source, a voltage reference, a low impedance device, and a voltage reference switch operational to selectively couple the voltage reference to the amplifier output via the low impedance device;

turning on the voltage reference switch prior to turning off the high level current source and the amplifier switch;

turning off the high level current source subsequent to turning on the voltage reference switch; and turning off the amplifier switch subsequent to turning off the high level current source, such that the voltage reference is coupled to the amplifier output via the low impedance device to maintain a constant common-mode voltage at the output and further such that only current provided by the low level current source is active to provide a low quiescent power level for the circuit.

* * * * *